(12) United States Patent
Derraa et al.

(10) Patent No.: US 6,791,149 B2
(45) Date of Patent: Sep. 14, 2004

(54) DIFFUSION BARRIER LAYER FOR SEMICONDUCTOR WAFER FABRICATION

(75) Inventors: Ammar Derraa, Boise, ID (US); Sujit Sharan, Chandler, AZ (US); Paul Castrovillo, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/287,569

(22) Filed: Nov. 4, 2002

(65) Prior Publication Data

US 2003/0077895 A1 Apr. 24, 2003

Related U.S. Application Data

(62) Division of application No. 09/942,108, filed on Aug. 29, 2001, now Pat. No. 6,746,952.

(51) Int. Cl.[7] .................... H01L 29/76; H01L 29/94; H01L 31/062; H01L 31/113; H01L 31/119

(52) U.S. Cl. ................................................ 257/415

(58) Field of Search .................... 257/412, 413, 257/9, 485, 486, 751, 767

(56) References Cited

U.S. PATENT DOCUMENTS

| | | | |
|---|---|---|---|
| 5,700,716 A | 12/1997 | Sharan et al. | 437/190 |
| 5,747,116 A | 5/1998 | Sharan et al. | 427/534 |
| 5,851,680 A * | 12/1998 | Heau | 428/472 |
| 5,908,947 A | 6/1999 | Vaartstra | 556/42 |
| 5,946,594 A | 8/1999 | Iyer et al. | 438/648 |
| 5,976,976 A | 11/1999 | Doan et al. | 438/683 |
| 5,977,636 A | 11/1999 | Sharan | 257/763 |
| 5,990,021 A | 11/1999 | Prall et al. | 438/745 |
| 6,037,252 A | 3/2000 | Hillman et al. | 438/637 |
| 6,054,191 A | 4/2000 | Sharan et al. | 427/534 |
| 6,086,442 A | 7/2000 | Sandhu et al. | 445/24 |
| 6,156,638 A | 12/2000 | Agarwal et al. | 438/627 |
| 6,184,135 B1 | 2/2001 | Ku | 438/683 |
| 6,200,649 B1 | 3/2001 | Dearnaley | 427/530 |
| 6,329,670 B1 | 12/2001 | Hu | 257/48 |
| 6,511,900 B2 | 1/2003 | Agarwal et al. | 438/592 |
| 6,630,391 B2 * | 10/2003 | Agarwal et al. | 438/532 |
| 6,635,939 B2 * | 10/2003 | Agarwal et al. | 257/412 |
| 2001/0002071 A1 | 5/2001 | Agarwal | 257/751 |
| 2001/0030235 A1 | 10/2001 | Hedemann et al. | 235/451 |
| 2001/0030552 A1 | 10/2001 | Hu | 324/763 |
| 2002/0001908 A1 | 1/2002 | Agarwal et al. | 438/300 |
| 2003/0025206 A1 | 2/2003 | Derraa et al. | |
| 2003/0042606 A1 | 3/2003 | Derraa | |
| 2003/0075802 A1 | 4/2003 | Derraa et al. | |

FOREIGN PATENT DOCUMENTS

| | | | | |
|---|---|---|---|---|
| JP | 05267220 | 10/1993 | | H01L/21/285 |
| JP | 09306870 | 11/1997 | | H01L/21/285 |

* cited by examiner

*Primary Examiner*—Craig A. Thompson
(74) *Attorney, Agent, or Firm*—Whyte Hirschboeck Dudek SC

(57) ABSTRACT

Diffusion barrier film layers and methods of manufacture and use are provided. The films comprise boron-doped $TiCl_4$-based titanium nitride, and provide an improved diffusion barrier having good adhesive, electrical conductivity, and anti-diffusion properties. The films can be formed on a silicon substrate without an underlying contact layer such as $TiSi_x$, an improvement in the fabrication of contacts to shallow junctions and other miniature components of integrated circuits.

49 Claims, 5 Drawing Sheets

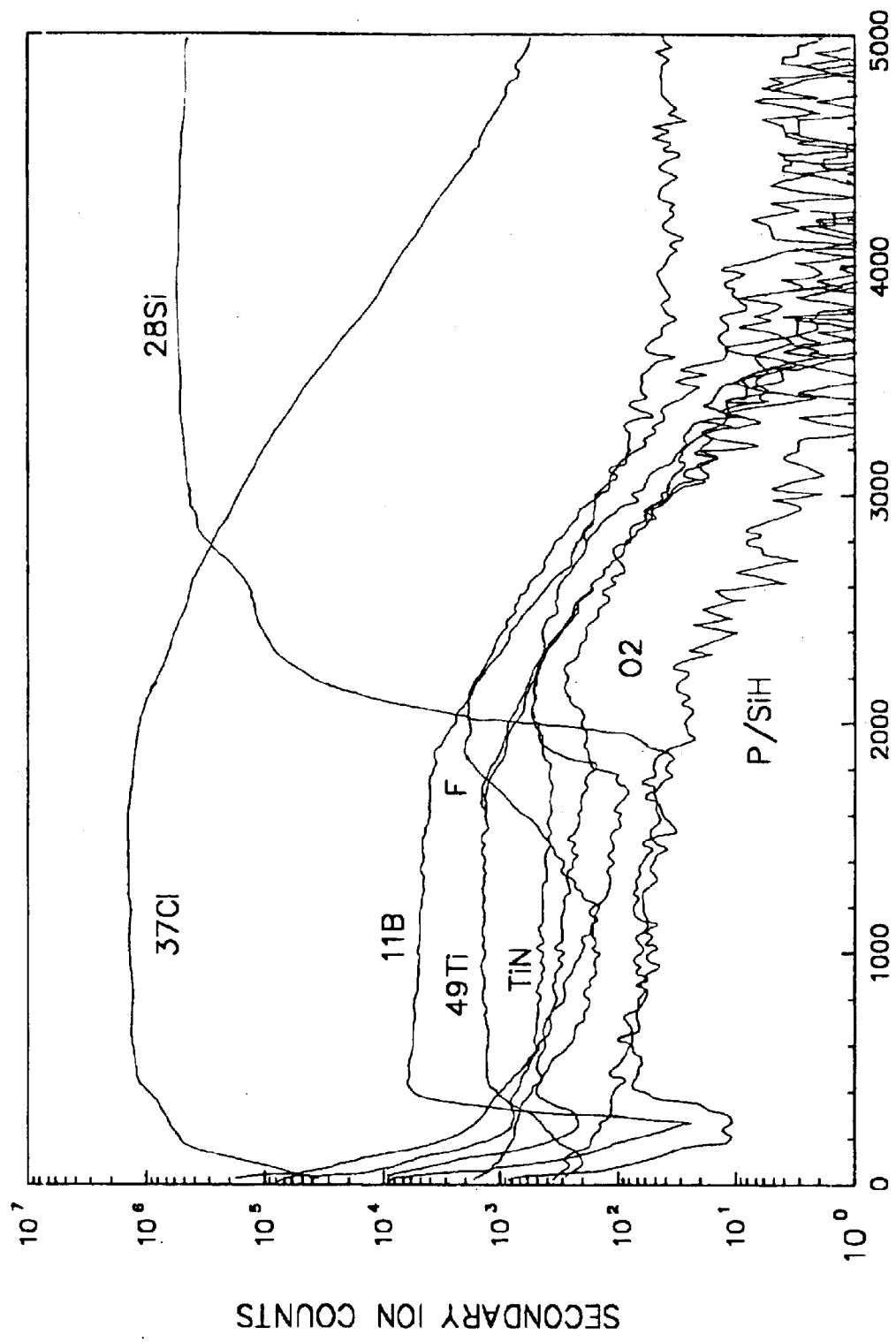

DIFFUSION BARRIER LAYER FOR SEMICONDUCTOR WAFER FABRICATION

This Application is a division of U.S. patent application Ser. No. 09/942,108, filed Aug. 29, 2001, now U.S. Pat. No. 6,746,952.

FIELD OF THE INVENTION

The present invention relates to the field of semiconductor wafer fabrication, and more particularly to barrier layers to restrict diffusion of materials.

BACKGROUND OF THE INVENTION

Integrated circuits are interconnected networks of resistors, transistors and other electrical components that are generally formed on a silicon substrate or wafer with conductive, insulative and semiconductive materials. Fabricating integrated circuits involves forming active device regions or components at a number of levels and different locations. The various components are then wired or interconnected together to form a memory or other electric circuit. To connect a conductive line fabricated above an insulator material and an underlying active device region, an opening is etched through the insulator layer to the active device region, and filled with an electrically conductive material such as polysilicon, tungsten, copper or aluminum, to provide the interlayer connection.

In forming an electrical connection to an active device region in a silicon semiconductor substrate, a diffusion barrier layer is laid down onto the substrate prior to depositing a conductive material. Such films act to prevent interdiffusion between the silicon and conductive material, which would destroy the contact.

Titanium nitride (TiN) is often used as a diffusion barrier in silicon integrated circuits because it serves as an impermeable barrier to silicon and to metals and other substances attempting to out-diffuse into the silicon. A thin layer of titanium (30–50 nm thick) is typically used under the TiN layer to make direct contact to silicon because it provides lower contact resistance to the silicon substrate than TiN. The titanium (Ti) film is deposited over the silicon substrate by sputtering or CVD, and is then reacted with the silicon during a anneal step to form a layer of titanium silicide ($TiSi_x$, predominantly $TiSi_2$) at the Ti/Si interface. A layer of TiN is then formed over the $TiSi_x$ contact layer, for example by CVD, to form a diffusion barrier layer, and a conductive material is deposited to fill the opening. The TiN layer also functions as an adhesion layer for the conductive fill, which is needed in the case of tungsten and copper because of their poor adhesion to insulators.

The continuing trend in the semiconductor industry is toward greater densification and miniaturization of semiconductor devices, including resistors, capacitors, diodes and transistors. This has been achieved, in part, by a reduction in the size of the various components. Such components can include junctions that are formed by doping silicon substrates located on integrated circuit wafers. These junctions are used to form source and drain regions of transistors, among other things, and comprise regions of silicon that are doped with dopants such as boron and phosphorus. Reducing the depth of a junction in a silicon substrate helps in producing an integrated circuit with high circuit density, high speed, and low power consumption, and helps density and miniaturize integrated circuits. Typically, such shallow junctions are less than about 0.2 microns deep.

Forming an adequate diffusion barrier layer and conductive contact over a shallow junction poses particular problems. The use of shallow junctions requires planar contact interfaces that only slightly penetrate the original silicon substrate, if at all, in order to avoid compromising the shallow junction. However, the use of a contact layer or diffusion barrier film that consumes or intermixes with a substantial portion of the silicon substrate during formation limits the ability to fabricate miniature devices that utilize shallow junctions or comprise other features that require a sharp interface between a silicon substrate and an overlying material.

Therefore, a need exists for a diffusion barrier film that overcomes these problems. It would be desirable to provide an improved diffusion barrier film that can be formed on a silicon substrate with minimal consumption of silicon, forms a sharp interface with the silicon substrate, and promotes adhesion of a contact fill material.

SUMMARY OF THE INVENTION

In one aspect, the invention provides a diffusion barrier layer comprising boron-doped titanium nitride (i.e., titanium boronitride, $TiB_xN_y$). The diffusion barrier layer formed on a semiconductor substrate forms a sharp interface with the underlying substrate with little or no diffusion or intermixing of elements of the diffusion barrier layer into the substrate. The film layer has improved mechanical and adhesive properties with substantially no reduction in conductive properties compared to a titanium nitride layer.

In another aspect, the invention provides methods of forming a diffusion barrier layer over a substrate in the construction of a conductive contact or other semiconductor structure. In an embodiment of the method, a thin layer comprising boron-doped titanium nitride film (i.e., titanium boronitride, $TiB_xN_y$) is deposited by chemical vapor deposition (CVD) onto a semiconductive substrate, preferably to a thickness of about 100 to about 500 angstroms. Preferably, the $TiB_xN_y$ layer is deposited from a gas mixture of titanium tetrachloride ($TiCl_4$), ammonia ($NH_3$), diborane ($B_2H_6$), and one or more carrier gases, by thermal CVD at a pressure of about 1 to about 15 Torr and a temperature of about 550 to about 700° C. The substrate and the diffusion barrier layer define a contact interface therebetween. The method can be utilized, for example, to form a conductive diffusion barrier layer over a semiconductive substrate relative to a contact opening in the fabrication of contacts to electrical components in an integrated circuit such as memory devices. In such a construction, the diffusion barrier layer is interposed between and in contact with the substrate and an electrically conductive fill material within the contact opening.

In another aspect, the invention provides an integrated circuit (IC) device. The IC device can comprise, for example, an array of memory or logic cells, internal circuitry, and at least one conductive contact coupled to the cell array and internal circuitry. In one embodiment, a conductive contact is formed in a contact opening through an insulating dielectric layer, over a thin conductive boron-doped titanium nitride diffusion barrier layer deposited onto and in contact with a semiconductive substrate at the bottom of the contact opening. The conductive contact is in electrical contact with a conductive region or active device area such as a source/drain region of a transistor, or other circuit element. In another embodiment, the IC device can comprise a semiconductive substrate with an overlying insulating dielectric layer and a contact opening formed therethrough that is filled with an electrically conductive fill material, with a boron-doped titanium nitride diffusion barrier layer that is interposed and in contact with the substrate and the fill material.

The invention overcomes problems associated with the use of titanium nitride diffusion barrier films on silicon and other semiconductive substrates, particularly limitations associated with the formation of tungsten plug fills. The present boron-doped titanium nitride films can eliminate the need for an underlying contact layer such as $TiSi_x$, which consumes a silicon substrate during formation. The films provide good adhesion of a contact fill material such as tungsten to an underlying silicon substrate, and a barrier to diffusion of silicon into the contact fill material as well as out-diffusion of the fill material and deposition by-products (e.g., fluorine) into the underlying silicon substrate. The films also form a sharp interface with a silicon substrate with little to no diffusion or intermixing of elements into the substrate, a particularly useful feature for the fabrication of miniature components of IC devices, such as DRAMs, SRAMs and FLASH memory evices, including devices that require shallow junctions. In addition, the processes of the invention are fast, simple and inexpensive to implement in a semiconductor manufacturing.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 2A–2C are depictions of secondary ion mass spectrometry (SIMS) depth profiles of a test structures showing relative concentration of elements at the interface between a silicon substrate and deposited diffusion barrier layer. FIG. 2A depicts the depth profile for a wafer having a silicon substrate onto which was deposited a titanium nitride layer. FIG. 2B depicts the depth profile for a wafer having a silicon substrate and a deposited overlayer of boron-doped titanium nitride. FIG. 2C depicts the depth profile for a wafer having a silicon substrate onto which were deposited overlying layers of titanium nitride and boron-doped titanium nitride.

DETAILED DESCRIPTION OF THE PREFERRED EMBODIMENTS

Figure 1A:
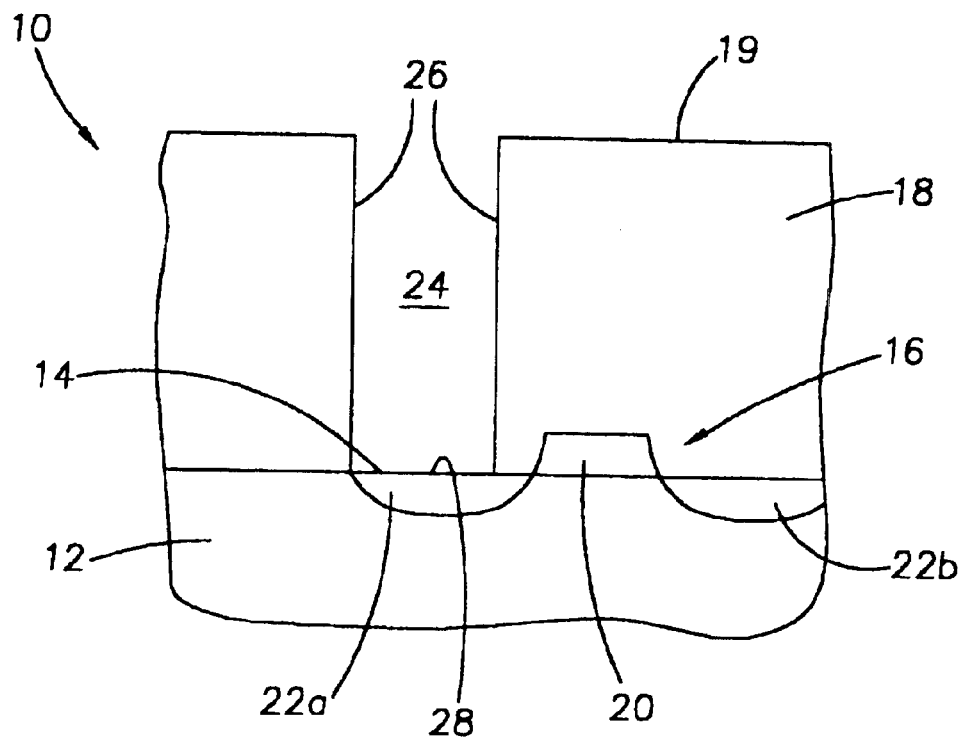
FIG. 1A is a diagrammatic cross-sectional view of a semiconductor wafer fragment at a preliminary step of a processing sequence.

The present invention relates to diffusion barrier films comprising boron-doped titanium nitride, which can be formed directly onto a semiconductive substrate and interposed between the substrate and a conductive material. The invention encompasses methods of making integrated circuits, particularly methods for forming conductive contacts for providing electrical connection between conductive or active device areas of semiconductor devices or portions of such devices. The present invention is particularly useful in the fabrication of miniature devices including conductive contacts to shallow junctions formed in a semiconductive substrate.

The invention will be described generally with reference lo the drawings for the purpose of illustrating the present preferred embodiments only and not for purposes of limiting the same. The figures illustrate processing steps for use in the fabrication of semiconductor devices in accordance with the present invention It should be readily apparent that the processing steps are only a portion of the entire fabrication process.

Integrated circuits include a large number of electronic semiconductor devices that are formed on varying levels of a semiconductor substrate. Exemplary semiconductor devices include capacitors, resistors, transistors, diodes, and the like. In manufacturing an integrated circuit, the discrete semiconductor devices that are located on nonadjacent structural levels are electrically connected, for example with an interconnect or conductive contact structure. The conductive contact generally comprises a region of conducting material that is formed between the semiconductor devices or portions of the semiconductor devices that are being placed in electrical communication. The conductive contact serves as a conduit for delivering electrical current between the semiconductor devices. Specific types of conductive contact structures include local interconnects, contacts, buried contacts, vias, plugs, and filled trenches. The present invention particularly deals with the method of making conductive contacts that are used in the fabrication of semiconductor devices.

In the current application, the terms "semiconductive wafer fragment" or "wafer fragment"or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

An embodiment of a method of the present invention is described with reference to FIGS. 1A through 1D, in a method of forming a diffusion barrier layer in the construction of a filled contact structure. The diffusion barrier layer is illustrated and will be described as overlying a diffusion region formed in a semiconductive substrate in the formation of a conductive contact. However, the diffusion barrier layer of the invention can be used wherever required within the structure of a semiconductor circuit to inhibit interdiffusion between two materials, for example, silicon and a conductive metal such as tungsten, or silicon and a dielectric material such as silicon dioxide, phosphosilicate glass (PSG), borosilicate glass (BSG), and borophosphosilicate glass (BPSG), among others.

Referring to FIG. 1A, a semiconductive wafer fragment 10 is shown at a preliminary processing step in the formation of a conductive contact. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as including a semiconductive substrate 12, an exemplary substrate being monocrystalline silicon. Formed at the surface 14 of the substrate 12 is a transistor structure 16 comprising a gate 20 and adjacent source and drain diffusion regions 22a, 22b, which can be formed by conventional methods known and used in the art.

An insulative layer 18 is formed over substrate 12. Exemplary materials include silicon dioxide ($SiO_2$), phosphosilicate glass (PSG), borosilicate glass (BSG), and borophosphosilicate glass (BPSG), in a single layer or multiple layers. The insulative layer 18 has been etched using a known photolithography technique, for example, reactive ion etching (RIE), while masking with a patterned photoresist layer (not shown) to provide a via or other contact opening 24 defined by insulative sidewalls 26 and a bottom portion 28. The contact opening extends to the diffusion region 22a (i.e., source/drain region) in the underlying substrate 12 to which electrical contact is to be made.

Figure 1B:
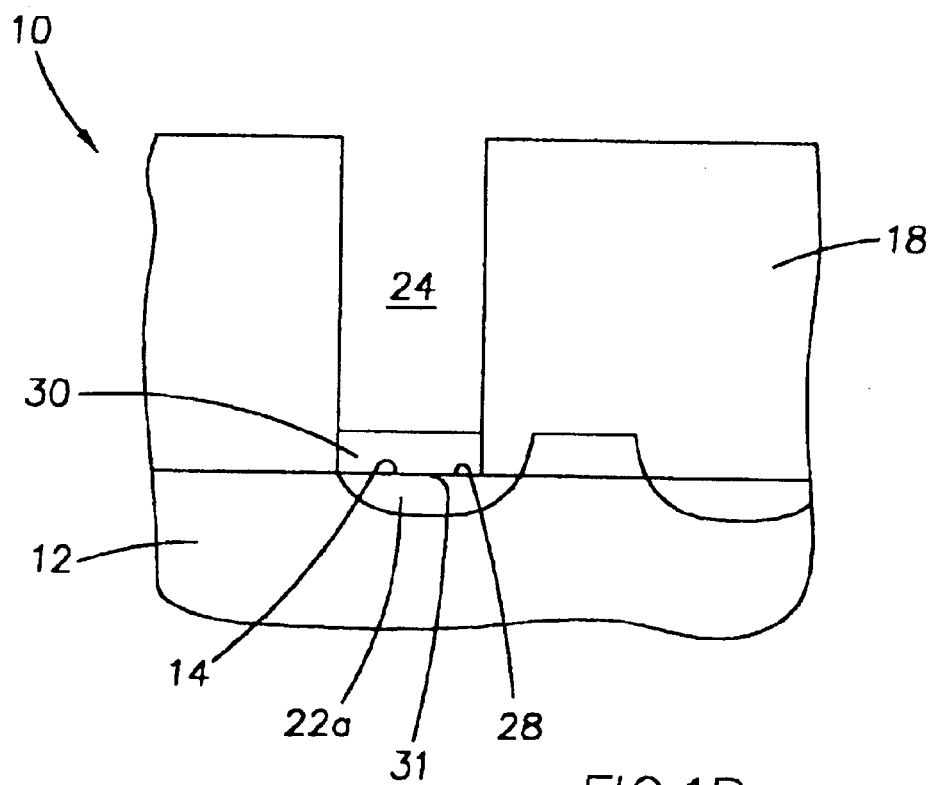
FIGS. 1B–1D are views of the wafer fragment of FIG. 1A at subsequent and sequential processing steps, showing fabrication of a contact in combination with a titanium boronitride ($TiB_xN_y$) barrier layer according to an embodiment of the method of the invention.

Referring to FIG. 1B, a diffusion barrier layer 30 comprising boron-doped, $TiCl_4$-based titanium nitride (titanium boronitride) is deposited over the diffusion region 22a within the substrate 12. The diffusion barrier layer 30 is provided to a thickness that is preferably about 100 to about 500 angstroms. The semiconductive substrate 12 and the diffusion barrier layer 30 define a contact interface therebetween, which results at the bottom of the contact opening 31. The diffusion barrier layer comprises an amount of titanium to provide a predetermined level of conductivity for electrical contact with the underlying conductive area and the overlying conductive fill.

Preferably, the diffusion thin barrier layer 30 is formed by a conventional thermal chemical vapor deposition (TCVD) process. Such TCVD techniques and process systems are well known in the art, as described, for example, in U.S. Pat. No. 6,037,252 (Hillman et al.), and U.S. Pat. No. 5,908,947 (Iyer and Sharan), the disclosures of which are incorporated by reference herein. TCVD systems include standard thermal reactors such as cold wall/hot substrate reactors and hot wall reactors, plasma-assisted reactors, radiation beam assisted reactors, and the like.

Typically, in a TCVD process, the substrate is placed in a chemical vapor deposition reactor chamber (not shown) in which the substrate and/or the gaseous precursor is heated. Preferably, the substrate is heated to a temperature in excess of the decomposition temperature of the precursor gases. When the gases are introduced into the reaction chamber and brought into contact with the substrate, the gases decompose on the surface of the substrate to deposit the titanium horonitride film layer 30 comprising the metal and elements of the precursor or reactant gases. The gaseous material is preferably deposited to a thickness of about 100 to about 500 angstroms, resulting in the thin diffusion barrier film 30 shown in FIG. 1B.

In an exemplary TCVD process to deposit a boron-doped TiN layer according to the invention using hot or cold wall thermal chemical vapor deposition, the wafer fragment 10 is positioned in the TCVD reactor (not shown) and a gaseous material comprising titanium tetrachloride ($TiCl_4$), diborane ($B_2H_6$), ammonia ($NH_3$), and inert carrier gases such as argon, helium and/or nitrogen, is flowed into the reactor under conditions effective to chemical vapor deposit a layer 30 of boron-doped, $TiCl_4$-based titanium boronitride over surface 14 of a silicon substrate at the bottom 28 of the contact opening 24. Preferred flow rates of the gases are about 100 to about 500 sccm $TiCl_4$, about 100 to about 1000 sccm $B_2H_6$, and about 100 to about 1000 sccm $NH_3$. The preferred temperature within the reactor (hot wall) or of the susceptor (cold wall) is from about temperature of about 550 to about 700° C., preferably about 560 to about 650° C., with pressure conditions within the reactor being from about 1 Torr to about 15 Torr, preferably about 10 Torr.

The deposited layer 30 comprises $TiCl_4$-based, boron doped titanium nitride having the general formula $TiB_xN_y$ (titanium boronitride). It was found that by adding $B_2H_6$ to $TiCl_4$ and $NH_3$ gaseous components, a diffusion barrier layer can he deposited on a semiconductive substrate whereby the contact interface between the substrate and the diffusion barrier is sharply defined, that is, there is little or no diffusion or intermixing of elements of the diffusion barrier layer (e.g., Cl, F, Ti, B, C, $O_2$) into the substrate. Preferably, any intermixing of elements of the diffusion barrier into the substrate is limited to a maximum depth of about 100 angstroms from the surface of the substrate, preferably to a depth of less than about 50 angstroms.

The addition of $B_2H_6$ also provides the film with a level of adhesiveness such that it will effectively adhere directly to the semiconductive substrate and to an overlying conductive metal. However, as the amount of boron increases, there is also a reduction in the level of conductivity (and increase in resistance) of the barrier layer 30. To counteract this effect, ammonia is flowed into the system in an amount effective to maintain the conductivity and step coverage of the formed diffusion barrier layer 30 at a predetermined level for an effective electrical contact with the diffusion area 22a.

Figure 1C:
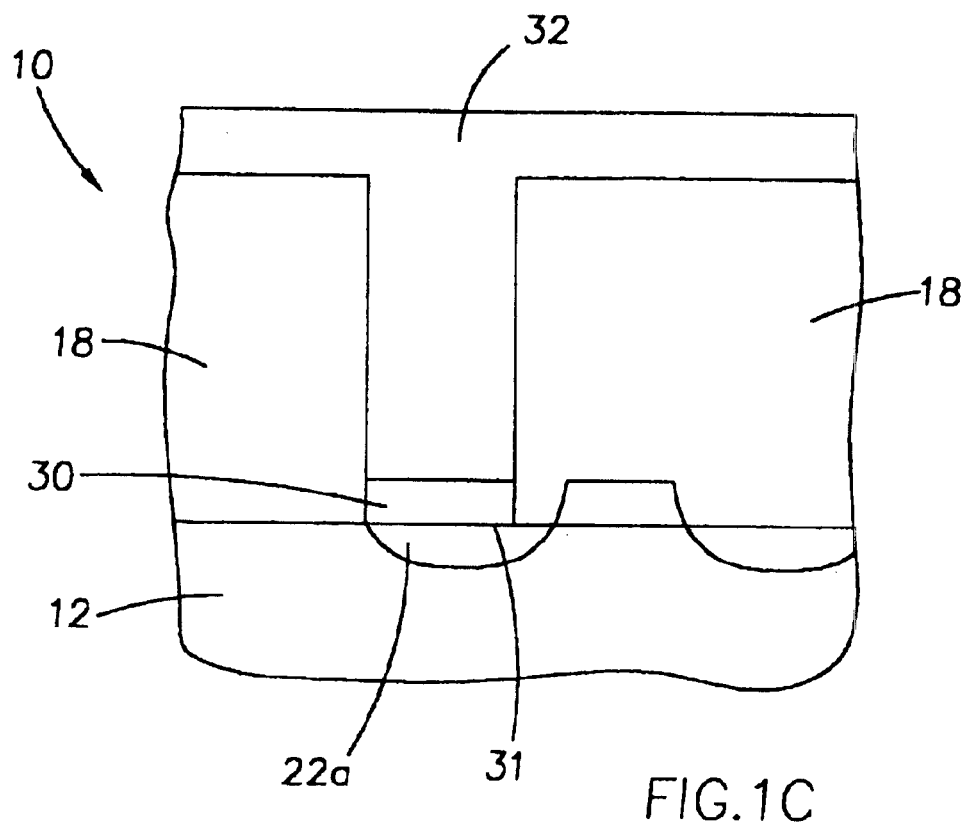

A plugging or fill layer 32 is then formed over the diffusion barrier layer 30 to fill the opening, resulting in the structure shown in FIG. 1C. Exemplary fill materials for forming a conductive contact include any conductive material such as polysil icon or other conductively doped semiconductive material, tungsten, aluminum, titanium, titanium nitride. To fill a contact opening, typically about 1000 to about 3000 angstroms of fill material is deposited.

Figure 1D:
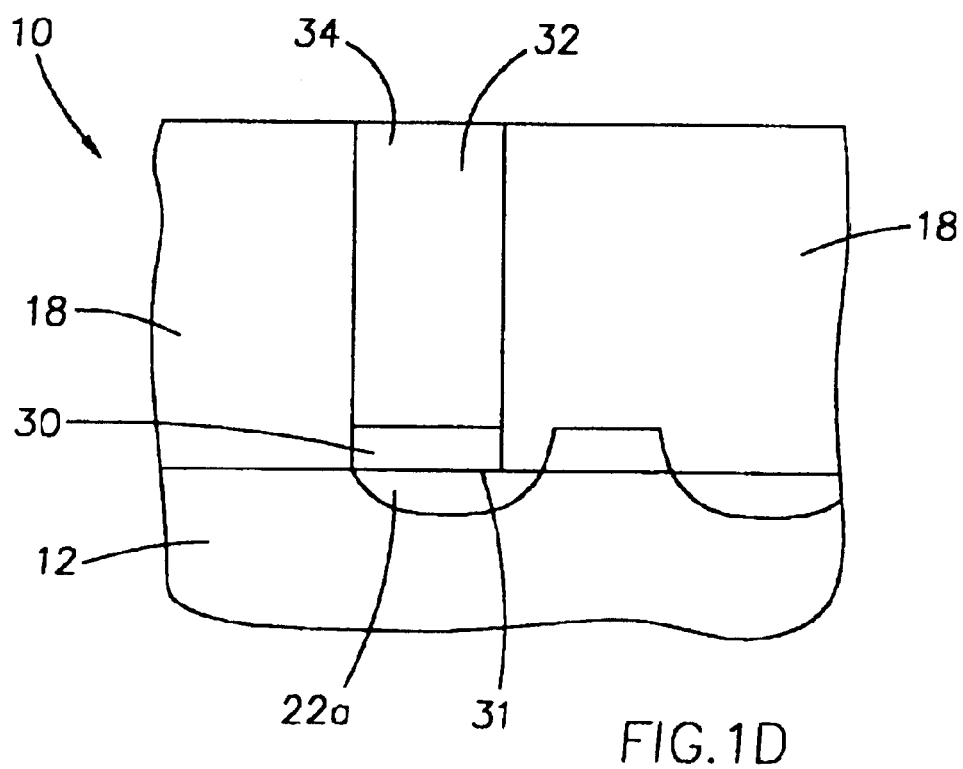

Referring to FIG. 1D, excess of the fill layer 32 can then be removed according to known methods in the art, for example, by chemical mechanical polishing (CMP). The finished construction includes a conductive contact 34 formed within the opening 24, which is in electrical connection with the diffusion region 22a through the conductive diffusion barrier layer 30.

Although not shown, a passivation layer can then be formed over the device. Optionally, other interconnects and contact structures (not shown) can be formed overlying the present structure.

Advantageously, the boron-doped titanium nitride film layer 30 forms a sharp interface between it and an underlying semiconductive substrate whereby there is no or little intermixing or diffusion of elements from the barrier layer into the substrate, thus enabling the fabrication and use of miniature device features in integrated circuits. The film layer functions as a diffusion barrier to restrict diffusion of material therebetween, including the interdiffusion of silicon into the contact fill material (e.g., tungsten) and the out-diffusion of the fill material for deposition by-products (e.g., fluorine) into the silicon. The diffusion barrier layer also provides improved adhesion of a contact fill material to a semiconductive substrate, and can possess a sufficient amount of conductivity for electrical contact between an active diffusion region in the underlying substrate and an overlying conductive fill material.

EXAMPLE

A comparison was made of the formation of diffusion barrier layers comprising different materials on a silicon substrate.

The materials were deposited onto separate silicon wafers by thermal CVD using an Applied Materials Centura System at a pressure of 10 Torr. The precursor gases were $TiCl_4$, $NH_3$, argon (Ar), and gaseous nitrogen ($N_2$), with and without diborane ($B_2H_6$). The temperature range was 560 to to 600° C.

On a first silicon wafer (#1), a thin layer of titanium nitride (TiN) was deposited to a thickness of 1500 angstroms. On a second silicon wafer (#2), a thin layer of boron-doped titanium nitride ($TiB_xN_y$) was deposited to a thickness of 1500 angstroms. On a third silicon wafer (#3), a thin layer of undoped TiN was deposited onto the silicon wafer, followed by a thin layer of boron doped TiN, to a total thickness of 1500 angstroms.

The wafers were analyzed by performing SIMS (secondary ion mass spectrometry) profiles to show relative concentrations of silicon (Si), titanium (Ti), titanium nitride (TiN), chlorine (Cl), fluorine (F), phosphorus (P), carbon (C), oxygen ($O_2$), and boron (B). As is known to those skilled in the art, SIMS utilizes an energetic ion bean (1–10 kev) to remove material from a sample surface and a mass analyzer to determine the mass/charge ratio of the resulting ions.

Figure 2A:
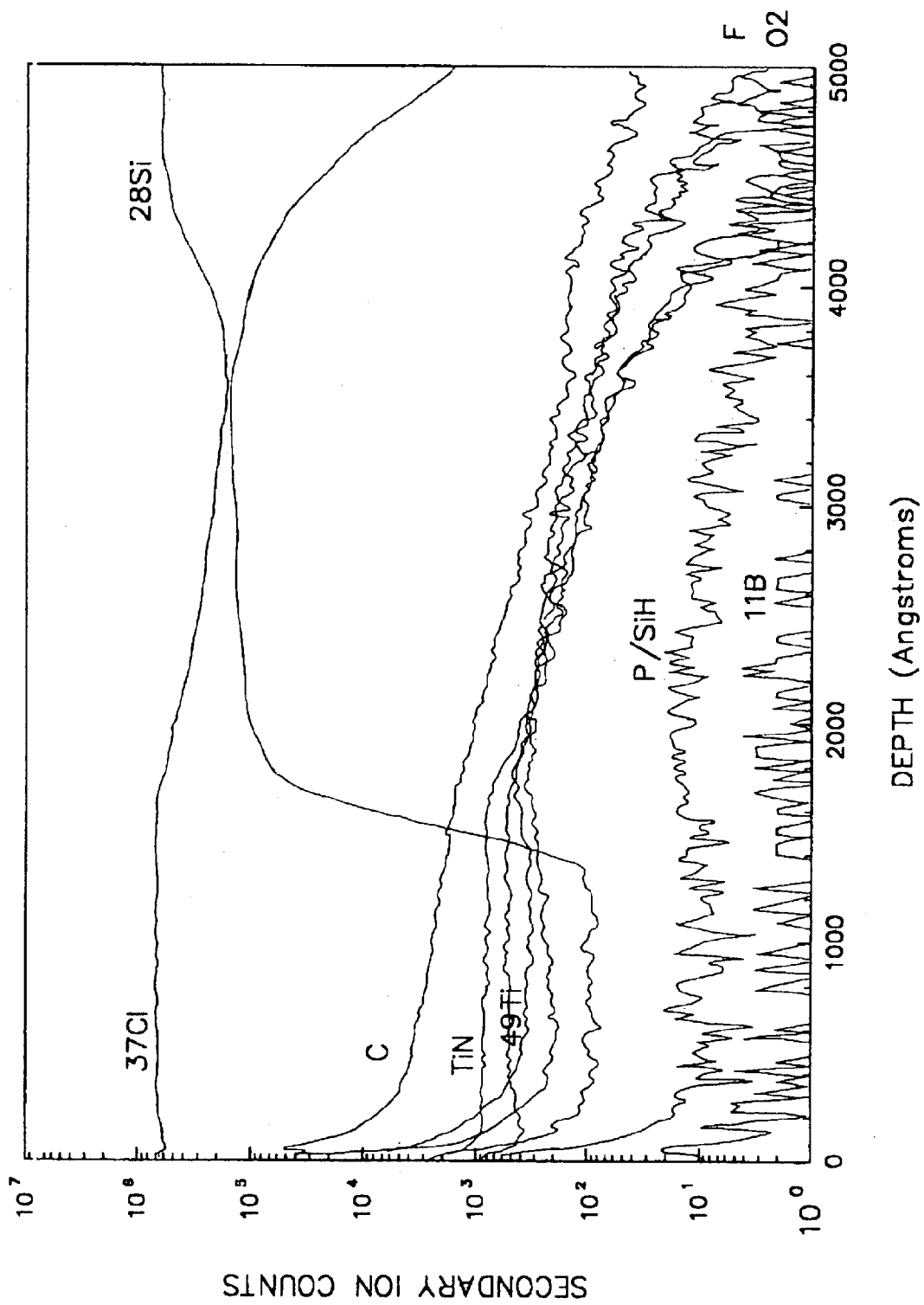
Figure 2B:
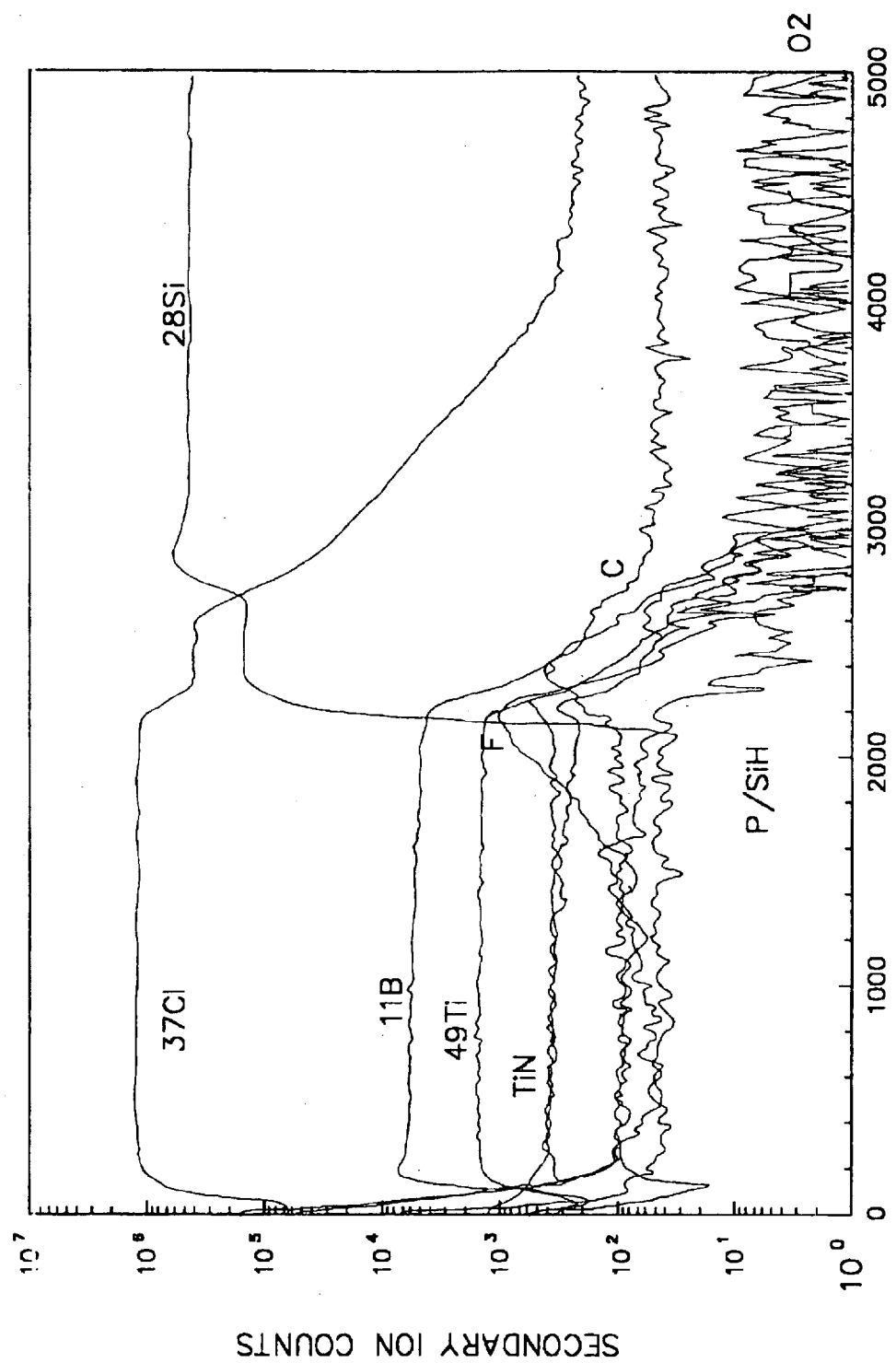

FIGS. 2A–2C are depictions of spectrographic concentrations of ions at various depths in angstroms into the surface of the wafers. The graphs show the concentration lines for the wafers, with the y-axis of the graphs representing secondary ion counts, and the x-axis of the graphs representing depth in a vertical direction from the top of the barrier layers.

As shown in FIG. 2B, for the $TiB_xN_y$ film, the reported concentrations of elements decreased significantly within the surface of the silicon substrate, showing a sharp interface between the two materials, compared to the titanium nitride layer (FIG. 2A) and the $TiN/TiB_xN_y$ overlayer structure (FIG. 2C).

The SIMS analysis of wafer #1 depicted in FIG. 2A, indicated an undefined boundary between the TiN layer and the silicon substrate, with diffusion of the elements (Cl, C, Ti, TiN) of the TiN film extending into the silicon substrate.

The SIMS analysis of wafer #2 depicted in FIG. 2B, indicated a sharp boundary between the TiN layer and the silicon substrate, with minimal diffusion of elements (Cl, C, Ti, TiN, B) of the titanium boronitride film into the silicon substrate.

The SIMS analysis of wafer #3 depicted in FIG. 2C, indicated the diffusion of elements (Cl, C, Ti, TiN) of the barrier layers into the silicon substrate. The interface between the two layers was less sharp than that of the barrier layer made solely of boron-doped titanium nitride.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A diffusion barrier layer comprising titanium boronitride, disposed over and in contact with a semiconductive substrate.

2. The diffusion barrier layer of claim 1, interposed between the substrate and a dielectric layer, and having a level of adhesion to adhere to the substrate and the dielectric layer.

3. The diffusion barrier layer of claim 1, interposed between a conductive region in the substrate and a layer comprising a conductive material, and having a level of adhesion to adhere to the substrate and the conductive layer, and a level of conductivity for electrical contact between the conductive region in the substrate and the conductive layer.

4. A diffusion barrier layer comprising titanium boronitride, interposed between and in contact with a semiconductor substrate and a conductive material, the diffusion barrier layer having a level of adhesion to adhere to the substrate and the conductive material.

5. The diffusion barrier layer of claim 4, wherein the substrate comprises a conductively doped diffusion region, and the diffusion barrier layer has a level of conductivity to provide electrical contact between the conductive layer and the diffusion region in the substrate.

6. A diffusion barrier layer, comprising titanium boronitride and interposed between a silicon-comprising substrate of a semiconductor device and a layer comprising a conductive material;
the diffusion barrier layer comprising an amount of boron and nitrogen to adhere to the substrate and the conductive layer, and maintain conductivity of the diffusion barrier layer for effective electrical contact between the conductive layer and a conductive area within the substrate.

7. A diffusion barrier layer overlying and in contact with a semiconductive substrate, the diffusion layer comprising titanium boronitride deposited onto the substrate by chemical vapor deposition of a mixture of titanium tetrachloride, ammonia and diborane to a thickness of about 100 to about 500 angstroms.

8. A diffusion barrier layer comprising titanium boronitride, disposed over and in contact with a shallow junction within a semiconductive substrate, the substrate and the diffusion barrier layer defining a contact interface therebetween, the shallow junction extending from the contact interface into the substrate;
wherein elements of the diffusion barrier layer are not present in a substantial amount at a depth of about 50 angstroms or more into the substrate from the contact interface.

9. The diffusion barrier layer of claim 8, wherein said elements are selected from the group consisting of chlorine, fluorine, titanium, boron, and carbon.

10. A semiconductor circuit, comprising:
a semiconductor structure comprising a semiconductive substrate;
an insulative layer disposed over the substrate, the insulative layer having a contact opening extending therethrough to the substrate;
a diffusion barrier layer comprising titanium boronitride disposed over the substrate within the opening, the substrate and the diffusion barrier layer defining a contact interface therebetween; and
a fill material within the contact opening over the diffusion barrier layer.

11. The semiconductor circuit of claim 10, wherein the diffusion barrier layer comprises an amount of adhesion to adhere to the substrate and the fill material.

12. The semiconductor circuit of claim 10, wherein the fill comprises a conductive material.

13. The semiconductor circuit of claim 12, wherein the diffusion barrier layer is disposed over a conductive area in the substrate, and has a level of conductivity for effective electrical contact between the conductive fill and conductive area in the substrate.

14. A semiconductor circuit, comprising:
a semiconductor structure comprising a silicon-comprising substrate;
an insulative layer disposed over the substrate, and having a contact opening extending therethrough to the substrate;

a diffusion barrier layer comprising titanium boronitride deposited onto the substrate from titanium tetrachloride, ammonia and diborane by thermal chemical vapor deposition; and a conductive contact within the contact opening over the diffusion barrier layer.

15. A semiconductor circuit, comprising:

a semiconductor structure comprising a semiconductive substrate, and an overlying insulative layer having a contact opening extending therethrough to the substrate; and a titanium boronitride diffusion barrier layer interposed between the substrate and an overlying fill material.

16. An integrated circuit, comprising:

a semiconductive substrate;

an insulating dielectric layer disposed over the substrate;

a contact opening formed into the insulating layer to the substrate;

an electrically conductive material substantially filling the contact opening; and a diffusion barrier layer interposed between and in contact with the semiconductor substrate and the electrically conductive fill within the contact opening, the diffusion barrier layer comprising a titanium boronitride material.

17. The integrated circuit of claim 16, wherein the diffusion barrier layer is formed by deposition of titanium tetrachloride, ammonia and diborane onto the substrate.

18. The integrated circuit, comprising:

a silicon substrate having a conductively doped diffusion region formed therein;

an insulating dielectric layer disposed over the silicon substrate;

a contact opening formed within the insulating layer to the diffusion region;

a diffusion barrier layer disposed over and in contact with the diffusion region in the silicon substrate; the diffusion barrier layer comprising titanium boronitride; and the contact opening filled with an electrically conductive material overlying and in contact with the diffusion barrier layer; the electrically conductive fill material in electrical connection with the diffusion region through the diffusion barrier layer.

19. An integrated circuit, comprising:

an array of memory cells;

internal circuitry; and at least one generally vertical conductive contact coupled to the memory array and the internal circuitry, the conductive contact disposed within a contact opening over a diffusion barrier layer overlying and in contact with a conductive area within a semiconductive substrate of the memory cell array, the diffusion barrier layer comprising titanium boronitride.

20. The integrated circuit of claim 19, wherein the diffusion barrier layer has a level of adhesion to adhere to the substrate and the conductive contact, and a level of conductivity for electrical contact between the conductive contact and conductive area in the substrate.

21. The integrated circuit of claim 19, wherein the diffusion barrier layer comprises chemical vapor deposited titanium tetrachloride, ammonia and diborane.

22. The integrated circuit of claim 19, wherein the conductive area comprises a shallow junction.

23. A semiconductor device, comprising: a diffusion barrier layer comprising titanium boronitride disposed over and in contact an active area within a substrate.

24. The device of claim 23, wherein the active area comprises a shallow junction.

25. The device of claim 23, wherein the active device area comprises a source or drain.

26. A conductive contact, comprising: a diffusion barrier layer comprising titanium boronitride disposed over and in contact within an active area within a substrate.

27. The contact of claim 26, wherein the diffusion barrier layer has a thickness of about 100 to about 500 angstroms.

28. A conductive contact, comprising: a diffusion barrier layer comprising titanium boronitride disposed over a substrate within an opening in the substrate, and a fill material disposed over the barrier layer within the opening.

29. The contact of claim 28, wherein the fill material is a conductive material.

30. The contact of claim 29, wherein the fill material is selected from the group consisting of polysilicon, tungsten, aluminum, titanium, and titanium nitride.

31. The contact of claim 28, wherein the fill material comprises polysilicon.

32. The contact of claim 28, wherein the barrier layer comprises an amount of boron effective to adhere to the substrate and to the fill material.

33. The contact of claim 28, wherein the barrier layer comprises an effective level of conductivity for electrical contact between the fill material and a conductive area disposed within the substrate.

34. The contact of claim 33, wherein the conductive area comprises a shallow junction.

35. The contact of claim 33, wherein the conductive area comprises a source or drain.

36. An integrated circuit, comprising:

an array of memory cells disposed within a substrate;

internal circuitry; and at least one conductive contact electrically connecting the memory cells array and the internal circuitry, the conductive contact disposed over a diffusion barrier layer comprising titanium boronitride in contact with an active area of the memory cell array.

37. A diffusion barrier layer, comprising titanium boronitride disposed over a semiconductive substrate, the diffusion barrier layer comprising an amount of boron effective to adhere the barrier layer to the substrate and an overlying conductive layer.

38. A diffusion barrier layer, comprising titanium boronitride disposed over a conductively doped area within a semiconductive substrate, the diffusion barrier layer comprising an amount of nitrogen effective to maintain a sufficient level of conductivity for electrical contact between an overlying conductive layer and the conductively doped area within the substrate.

39. A diffusion barrier layer, comprising titanium boronitride disposed over a conductively doped area within a semiconductive substrate, the diffusion barrier layer comprising an amount of boron effective to adhere the barrier layer to the substrate and an overlying conductive layer, and an amount of nitrogen effective to maintain a sufficient level of conductivity for electrical contact between the overlying conductive layer and the conductively doped area within the substrate.

40. A conductive contact, comprising:

a diffusion barrier layer comprising titanium boronitride disposed over a semiconductive substrate within an opening in the substrate; and a fill material disposed over the barrier layer within the opening;

wherein the diffusion barrier layer comprises an amount of boron effective to adhere to the substrate and the fill material.

41. A conductive contact, comprising:

a diffusion barrier layer comprising titanium boronitride disposed over a semiconductive substrate within an opening in the substrate; and a conductive material disposed over the barrier layer within the opening;

wherein the diffusion barrier layer comprises an amount of boron effective to adhere to the substrate and the conductive material, and an amount of nitrogen effective to maintain a sufficient level of conductivity for electrical contact between the conductive material and a conductive area in the substrate.

42. A semiconductor circuit, comprising:

a semiconductor structure comprising a semiconductive substrate;

an insulative layer disposed over the substrate and having an opening extending therethrough to the substrate;

a diffusion barrier layer comprising titanium boronitride disposed over the substrate within the opening; and a fill material disposed over the diffusion barrier layer within the opening.

43. A semiconductor circuit, comprising:

a semiconductor structure comprising a semiconductive substrate;

an insulative layer disposed over the substrate and having an opening extending therethrough to the substrate;

a diffusion barrier layer comprising titanium boronitride disposed over the substrate within the opening; and a fill material disposed over the diffusion barrier layer within the opening;

wherein the diffusion barrier layer comprises an amount of boron effective to adhere to the substrate and the fill material.

44. A semiconductor circuit, comprising:

a semiconductor structure comprising a semiconductive substrate having a conductive area disposed therein;

an insulative layer disposed over the substrate and having an opening extending therethrough to the conductive area in the substrate;

a diffusion barrier layer comprising titanium boronitride disposed over the conductive area in the substrate within the opening; and a conductive material disposed over the diffusion barrier layer within the opening;

wherein the diffusion barrier layer comprises an amount of boron effective to adhere to the substrate and the conductive material, and an amount of nitrogen effective to maintain a sufficient level of conductivity for electrical contact between the conductive material and the conductive area in the substrate.

45. An integrated circuit, comprising:

a semiconductive substrate;

an insulative layer disposed over the substrate;

an opening disposed in the insulative layer to the substrate;

a conductive material disposed within the opening; and a diffusion barrier layer comprising a titanium boronitride material disposed within the opening between the semiconductive substrate and the conductive material.

46. An integrated circuit, comprising:

a semiconductive substrate;

an insulative layer disposed over the substrate;

an opening disposed in the insulative layer to the substrate;

a conductive material disposed within the opening; and a diffusion barrier layer comprising a titanium boronitride material disposed within the opening between the semiconductive substrate and the conductive material, the diffusion barrier layer comprising an amount of boron effective to adhere to the substrate and the conductive material.

47. An integrated circuit, comprising:

a semiconductive substrate having a conductive area disposed therein;

an insulative layer disposed over the substrate;

an opening disposed in the insulative layer to the substrate;

a conductive material disposed within the opening; and a diffusion barrier layer comprising a titanium boronitride material disposed within the opening between the semiconductive substrate and the conductive material, the diffusion barrier layer comprising an amount of boron effective to adhere to the substrate and the conductive material and an amount of nitrogen effective to maintain a sufficient level of conductivity for electrical contact between the conductive material and the conductive area in the substrate.

48. An integrated circuit, comprising:

an array of memory cells disposed within a substrate;

internal circuitry; and at least one conductive contact electrically connecting the memory cells array and the internal circuitry, the conductive contact disposed over a diffusion barrier layer comprising titanium boronitride in contact with an active area of the memory cell array, the diffusion barrier layer comprising an amount of boron effective to adhere to the substrate and the conductive contact.

49. An integrated circuit, comprising:

an array of memory cells disposed within a substrate;

internal circuitry; and at least one conductive contact electrically connecting the memory cells array and the internal circuitry, the conductive contact disposed over a diffusion barrier layer comprising titanium boronitride in contact with an active area of the memory cell array, the diffusion barrier layer comprising an amount of boron effective to adhere to the substrate and the conductive contact and an amount of nitrogen effective to maintain a sufficient level of conductivity for electrical contact between the conductive contact and the memory cell array.

* * * * *

UNITED STATES PATENT AND TRADEMARK OFFICE
CERTIFICATE OF CORRECTION

PATENT NO. : 6,791,149 B2
DATED : September 14, 2004
INVENTOR(S) : Ammar Derraa et al.

It is certified that error appears in the above-identified patent and that said Letters Patent is hereby corrected as shown below:

Column 1,
Line 17, replace "insilative" with -- insulative --.

Column 3,
Line 17, replace "evices" with -- devices --.
Line 66, replace "lo" with -- to --.

Column 5,
Line 40, replace "horonitride" with -- boronitride --.

Column 6,
Line 24, replace "polysil icon" with -- polysilicon --.

Signed and Sealed this

Twenty-first Day of December, 2004

JON W. DUDAS
*Director of the United States Patent and Trademark Office*